(12) United States Patent
Waschura

(10) Patent No.: US 7,467,336 B2
(45) Date of Patent: Dec. 16, 2008

(54) METHOD AND APPARATUS TO MEASURE AND DISPLAY DATA DEPENDENT EYE DIAGRAMS

(75) Inventor: Thomas E. Waschura, Menlo Park, CA (US)

(73) Assignee: Synthesys Research, Inc, Menlo Park, CA (US)

( * ) Notice: Subject to any disclaimer, the term of this patent is extended or adjusted under 35 U.S.C. 154(b) by 726 days.

(21) Appl. No.: 11/089,565

(22) Filed: Jan. 24, 2005

(65) Prior Publication Data

US 2005/0246601 A1    Nov. 3, 2005

(51) Int. Cl.
*G06F 11/00* (2006.01)
(52) U.S. Cl. ..................................... 714/704
(58) Field of Classification Search ................ 714/704, 714/724, 736, 819; 703/2; 716/4
See application file for complete search history.

(56) References Cited

U.S. PATENT DOCUMENTS

| | | | | |
|---|---|---|---|---|
| 5,124,849 | A * | 6/1992 | Chur | 360/31 |
| 6,715,112 | B2 * | 3/2004 | Jungerman | 714/704 |
| 6,728,311 | B1 * | 4/2004 | Waschura et al. | 375/224 |
| 7,310,389 | B2 * | 12/2007 | Waschura et al. | 375/340 |
| 2003/0177438 | A1 * | 9/2003 | Waschura et al. | 714/819 |

* cited by examiner

*Primary Examiner*—Phung M Chung
(74) *Attorney, Agent, or Firm*—Peninsula IP Group; Douglas A. Chaikin

(57) ABSTRACT

A method and apparatus to draw eye diagrams of multi-valued signals that remove non-data dependent effects is disclosed. An exemplary method includes collecting event counts at variable bit offsets, desired time offsets within one or more bit periods and desired voltage offsets within a voltage region of interest; removing non-data dependent effects from the collected event counts; generating a composite diagram of the desired time offsets within the one or more bit periods of interest and desired voltage offsets within the voltage region of interest; and displaying the composite diagram. An exemplary apparatus includes a windowed comparator operative to receive an input signal and generate an output signal having a first value if the input signal is within a desired voltage region; a sampling device, coupled to the windowed comparator, operative to sample the output signal and generate a logical signal at desired time intervals; an event array counter, coupled to the sampling device, operative to generate a count value signal representing the number of sampled inputs within one or more desired time offsets and the desired voltage regions; and a trigger processing circuit, coupled to the event array counter, operative to generate a bit offset signal that controls the counting of the event array counter in response to a test pattern signal.

13 Claims, 5 Drawing Sheets

1

METHOD AND APPARATUS TO MEASURE AND DISPLAY DATA DEPENDENT EYE DIAGRAMS

BACKGROUND OF THE INVENTION

1. Field of the Invention

This invention relates to systems that measure multi-valued signal electrical or optical eye-diagram waveforms of high-speed data communications devices, sub-components or links such as oscilloscopes, jitter analyzers and bit error rate testers as well as built-in test features in ATE equipment and communications devices and systems.

2. Description of the Related Art

Eye diagrams, the bit-synchronized persistent overlay of all possible bit transitions in a multi-valued data stream, are commonly used to grade the quality of a data stream used, for example, in digital data communications. Eye diagrams may be constructed using well understood and generically applied oscilloscope devices and oscilloscope sampling features built into other analyzers including jitter analyzers. Additionally, the ability to draw eye diagrams using a binary decision circuit and a window decision circuit has been previously disclosed by the instant inventor, for example, in U.S. patent application Ser. Nos. 09/541,970 and 10/099,487 which are hereby incorporated in their entirely herein.

Some eye diagrams have poor eye openings which are defined as having a small opening at the center of the eye between logical one values and logical zero values; thereby, making a logical decision of a high level or a low level very error-prone. Communication signals with such eye diagrams are more difficult to use for digital communications.

There are many reasons that bit transitions in a multi-valued data stream may stray from their nominal path from bit to bit down the data stream. These reasons include, but are not limited to, baseline wander of logic zeros and logic ones, noise added throughout the signal and jitter in data bit transitions. Some of these reasons depend on the data value and recent data value history that is being transmitted, where other reasons are completely independent of the data values and recent history.

Conventional techniques have used eye diagram sampling oscilloscopes to draw an eye diagram where the non-data dependent effects were removed by averaging a number of samples of the multi-valued signal amplitude and including in the average only points that corresponded to a particular bit offset (e.g. trigger offset) within the test pattern being used. This has been implemented as turn-key features in sampling oscilloscopes from Hewlett-Packard, Agilent Technologies and Tektronix, and has been generically implemented in research & development laboratories in more manual test setups.

In the aforementioned techniques oscilloscopes are necessary to make such a measurement which, in cases where an oscilloscope is otherwise not required, means the additional expense of an oscilloscope when eye diagrams are desired that remove the non-data dependent effects. An additional drawback of the aforementioned and analogous techniques is that the amount of samples included in the average for individual bit positions of the multi-valued data signal under test is fixed at an inherent effective sampling speed of below 200 K sample/sec and specifically does not scale as with the data rate.

In systems disclosed in the field by the present inventor, eye diagrams are measured and displayed that use either single threshold slice-mode comparators or window-mode comparators. Implementations of these concepts result in eye diagrams with the same features as regular sampling oscilloscopes without emphasizing data-dependent effects.

As disclosed, for example, in Jungerman, et. al. U.S. Pat. No. 6,715,112 triggered waveforms can be performed by sweeping bit error rate measurements versus voltage threshold and differentiating the results to find the peak of bit error rate and to use the threshold voltage of the maximum bit error rate value as the voltage value of the triggered waveform at time various increments. Triggered waveforms such as those disclosed by Jungerman are not eye diagrams. They do not overlay all types of bit transitions in the multi-valued signal atop each other to display the eye opening. Furthermore, restricting a device to operate with an "error performance analyzer" as described in Jungerman, et al. and in conditions where a bit error rate can be measured (e.g. where a second reference copy of the pattern being used in the test is known and synchronized-to) is not a desirable constraint and a method that makes no such restriction would clearly be a substantial improvement.

SUMMARY OF THE INVENTION

In the present invention, eye diagrams of multi-valued signals are created using, among other elements, a windowed-comparator, derived pattern trigger and event counter. This may be accomplished, for example, by processing the results of event count measurements taken while positioning the windowed comparator limits to cover all voltage offsets of interest and all time offsets within the bit period, or multiple bit periods, of the eye diagram and where this processing includes using the derived pattern trigger to attribute each count to an appropriate bit offset within the data pattern of the multi-valued signal, and further including determining the mean sample value for each time offset within the bit period for all bit offsets within the data pattern, and further including drawing/overlaying each mean sample for all time offsets within the bit period of the eye diagram coming from all attributed bits in the data pattern of the multi-valued signal.

This invention specifically does not employ bit error rate measurement techniques that require having a substantially similar reference multi-valued signal as well as the multi-valued signal under test and a synchronization method to lock such waveforms together such that one signal can be used as a reference for measuring bit errors in the other.

Devices under test output multi-valued signals. These signals may be tested, for example, by looking at an eye diagram representation. Eye diagrams show overlays of all possible bit transitions (e.g. high to low, low to high, high to high and low to low) in all possible history states. According to the present invention, a method of measuring and displaying data-dependent eye diagrams includes: collecting event counts at various bit offsets, desired time offsets within the bit period or periods and desired voltage offsets within the voltage offset region of interest; removing the non data-dependent effects from the collected event counts through averaging; creating a composite diagram of desired time offsets within the bit period or periods and desired voltage offsets within the voltage offset region of interest; and displaying the result.

Collecting Event Counts

Events are armed to count when the voltage of a multi-valued signal under test falls between the $V_{hi}$ and $V_{low}$ limit range at a particular time instant defined by the rising or falling edge of a variably delayed clock signal plus any fixed delay offset in the system. An armed count is actually counted in an event counter at most once per clock period as long as the event counting has not been disabled. Event counting may be disabled because the given bit offset within the multi-valued signal under test at the time of sampling is of little interest for a given measurement or out of convenience because no measurements are being made.

The present invention chooses one of many possible algorithms for visiting a sufficient number of regions representing the voltage offsets of interest and the time offsets within one or more bit periods to cover the eye diagram area of interest. One algorithm employed in an exemplary embodiment is to sequentially take event measurements over the same number of enabled clock bits at a given time offset within the bit period or periods at all voltage offsets in increments of $V_{delta}$ (which represents the desired voltage resolution of the eye diagram) from $V_{top}$ to $V_{bottom}$ and with window sizes of $V_{delta}$ (defined by the subtraction of $V_{hi}$-$V_{lo}$) and once completed with this column of measurements, to increment the time offset within the bit period or periods by a desired time increment amount, $T_{delta}$ which reflects the desired time resolution of the eye diagram; and repeat the process for the next column. This process is then repeated for every column between 0 and $T_{max}$ (where $T_{max}$ is the amount of time to be shown in the x-axis of the eye diagram) at the desired increment resolution of $T_{delta}$.

Other algorithms for collecting event counts may include options to collect data in a different order or to optimize which areas actual collection is performed based on various factors including, but not limited to, image recognitions of the eye diagram which can predict where active multi-level signal voltages are probable.

In an exemplary embodiment, once collected, a data structure representation is built or otherwise derived from all event counts taken. This can, but is not limited to, take the form of a three-dimensional memory array of event count values, where the axes of the three dimensions represent the voltage offset, time offset within the bit period or periods, and the bit position within the data pattern represented by the multi-valued signal.

Processing Collected Data

Processing the collected event count data to remove any non-data dependent effects from the collected event data is accomplished by creating a new data representation where the multiple non-zero event counts of the collected data that may occur in every column of every plane of event count data representing each bit offset within the multi-valued signal data pattern are used to determine the average voltage offset for each column for each bit offset of the data pattern plane. This process establishes a single voltage waveform, the average voltage waveform, of the multi-valued input signal individually for all bit offsets in the data pattern.

This data can be represented by a three-dimensional array of Boolean values where the axes of the three dimensions represent the time offset within the bit period or periods, the bit position within the data pattern represented by the multi-valued signal and the logic (e.g. true or false) state of whether that voltage offset within the voltage offset range of interest is the average voltage offset or not. Note that this logical functionality could be met in a data structure that uses more bits of representation than just a Boolean.

Overlay Eye Diagram

The eye diagram display is a composite display of overlaid samples that represent all possible bit transitions in a data pattern coming from the multi-valued signal from the device under test. In this invention, an eye diagram that emphasizes data-dependent effects is constructed by overlaying averaged waveforms that each represents individual bit transition types in the multi-valued signal. Once the processing of collected data is accomplished to remove, through finding the average, the non-data dependent effects from the individual waveforms, these waveforms can be aggregated to make an eye diagram.

The process of overlaying multiple data waveforms for the purpose of making an eye diagram can be accomplished in many ways that are generally understood by technicians trained in the art of image edition and composition. In an exemplary embodiment of the present invention, a data structure that represents the eye diagram to be displayed which includes on/off, gray-shaded or colored pixel representations of all voltage offsets in the voltage offset region of interest and all desired time offsets within the bit period or periods is built. This is done, for example, by logically "OR"-ing each like-positioned pixel from all data planes in the 3-dimensional representation that correspond to each bit offset in the data pattern found in the multi-valued signal from the device under test. In this fashion, a pixel is one color if one or more of the averaged bit positions within the multi-valued signal went through the voltage offset and time offset corresponding to the pixel position.

Similarly, a gray-shaded or colorized representation of the eye diagram may be created by arithmetically accumulating the number of TRUE like-positioned pixels in the processed 3-dimensional data. In these cases, pixels that have 1 count mean that one waveform type was present at that pixel location; pixels that have 2 counts mean that two waveform types were present at that pixel location, etc. These counts can then be used to adjust brightness of the pixel whereas one shade, brightness or color might be used to represent the number, or population, of averaged waveforms that was present at a particular pixel location where each pixel location represents a particular voltage offset in the voltage region of interest, and a particular time offset in the bit period or periods in the time region of interest.

Display Result

Once overlay data is generated, the result may be displayed in a manner familiar and similar to other eye diagram displays. Graphic computer displays of any type including but not limited to flat panel displays, CRTs, print-outs are all examples of devices that can be use to display the result, an eye diagram that emphasizes data-dependent effects.

An object of the present invention is to be able to measure and display eye diagrams that emphasize data dependent effects by removing the non-data dependent effects through processing.

Another object of the present invention is to display eye diagrams that emphasize data dependent effects by removing the non-data dependent effects through processing using the sampling capabilities of a windowed bit comparator, derived pattern trigger and event counter which scale with data rate rather than an oscilloscope.

Yet another object of the present invention is to display eye diagrams that emphasize data dependent effects by removing the non-data dependent effects while not requiring bit error rate measurements or the combined elements of an "error performance analyzer".

BRIEF DESCRIPTION OF THE DRAWING

For a further understanding of the objects and advantages of the present invention, reference should be had to the following detailed description, taken in conjunction with the accompanying drawings, in which like parts are given like reference numerals and wherein:

FIG. 3.b. is a schematic diagram of a trigger decoder used with an alternate preferred embodiment from FIG. 1;

FIG. 4.b. illustrates an example of the result of illustrates transforming two dimensional arrays of window counts into a two dimensional array with the averaged value of the multi-valued signal;

DETAILED DESCRIPTION OF THE INVENTION

The present invention will now be described in greater detail with reference to the accompanying drawings, in which exemplary embodiments of the invention are shown. The present invention may, however, be embodied in many different forms and should not be construed as limited to the embodiments set forth herein; rather the embodiments are provided so that this disclosure will be thorough and complete and will fully convey the invention to those skilled in the art.

Figure 1:
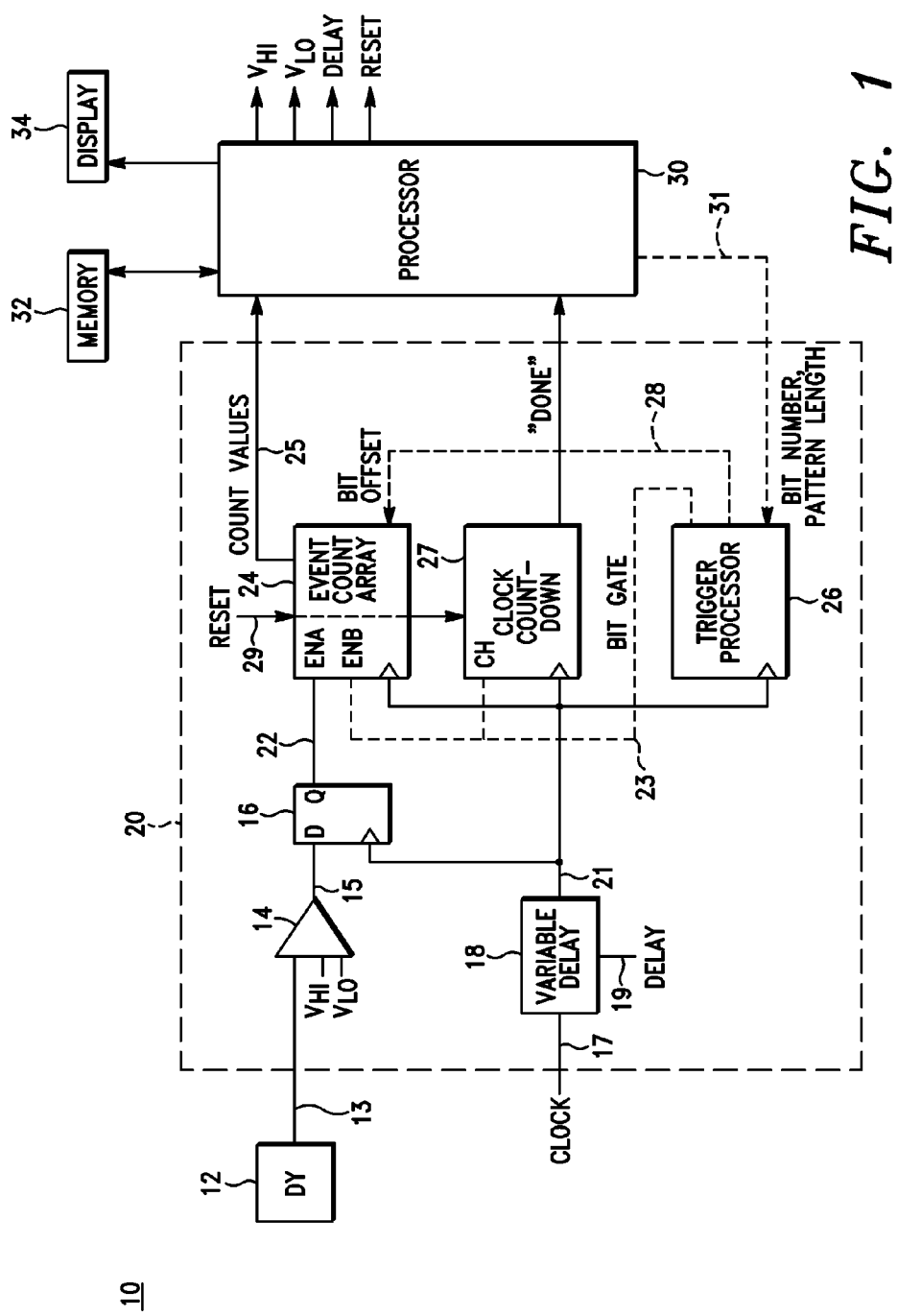
FIG. 1 illustrates a detailed block diagram of a preferred embodiment of the present invention using a trigger decoder and event counters.

FIG. 1 shows a block diagram of a sampling circuit 10, employing the measurement circuit or apparatus 20 of the present invention. A device under test 12 outputs a multi-valued signal 13, which is to be measured. This multi-valued signal 13 is presented to a windowed-comparator 14 where it is compared against voltage levels, Vhi and Vlo. If the voltage of the multi-valued signal 13 is greater than $V_{lo}$ and less than $V_{hi}$, the windowed-comparator 14 provides a logical TRUE. Note that comparators that use inverted logic could equally be used in this invention. The result of this logical window comparison 15 is presented to a sampling device 16, for example, a D-type flip flop who's function is to sample the logic TRUE or FALSE state of the output of the windowed comparator 15 at a time designated by the rising (or falling, or both) edge of the clocking signal or strobe 21 presented to the clock input of the sampling device 16 by a variable delay circuit 18.

The clocking signal 21 of the present invention must be synchronous to the bit periods of the data being carried by the multi-valued signal 13, and can be at the same data rate or any fixed integer divider of the data rate that is convenient. In the exemplary embodiment, a full bit-rate clock (e.g. CLOCK) is used which can come either from the device under test 12 or from the stimulus or other related electronics connected in the test system used for the purpose of creating or recovering a bit-synchronized data rate clock.

In order to move the sampling time to all bit offsets within the bit period of the data carried on the multi-valued signal 13, a variable delay circuit 18 is employed in the exemplary embodiment. The variable delay circuit 18 accepts the incoming bit-synchronized clocking signal 17 and outputs a like-copy of the bit-synchronized clocking signal 21 with a programmable amount of delay 19 inserted. The variable-delayed sample clock signal 21 is used as the sampling strobe to the sampling device 16 to instruct the sampling device 16 to sample the signal 15 from the windowed-comparator 14. The output 22 of the sampling device 16 is a logic TRUE or logic FALSE depending on whether the voltage of the multi-valued signal 13 is within the boundaries of $V_{hi}$ and $V_{lo}$ at the time of the sample.

It will be understood by those skilled in the art, that there are numerous configurations of electronic circuits that could be employed to similarly derive a logical signal that is a logic TRUE or logic FALSE depending on whether the voltage of the multi-valued signal 13 is within the boundaries of Vhi and Vlo at the time of the sample. For instance, this can be done with two single-threshold voltage comparators and a logical AND function; this can be done with two single-threshold voltage comparators, two sampling flip flops and a logical AND function after the sampling device, and other suitable circuits. These variations for creating a logic TRUE or logic FALSE signal depending on whether the voltage of the multi-valued signal is within the boundaries of $V_{hi}$ and $V_{lo}$ at the time of the sample are contemplated by the present invention and thereby fall within the scope of this disclosure.

The signal 22 which holds a logic TRUE or logic FALSE signal depending on whether the voltage of the multi-valued input signal 13 is within the boundaries of $V_{hi}$ and $V_{lo}$ at the time of the sample is then used as a count enable of a digital counting device 24, the event array counter, which will increment a count value 25 on the next rising edge of the clock signal 21. The clock signal applied to the post-sampled processing of this invention could either be the variable delayed clock 21 or, by employing special techniques to compensate for possible setup and hold variations that may occur, can be a direct copy of the input clock signal 17. In order to count, the event array counter 24 may also be further gated by an additional count-enabling function 23 that restricts the event counting only to those bit cells as determined by a trigger processing circuit 26, for example, a microprocessors, a corresponding piece of software code being executed on one or more processors, a dedicated piece of hardware (e.g. ASIC), logic circuitry, a state machine or any suitable device capable of processing input data. If the present invention is implemented as software code, the program instructions that would comprise such software code would be stored on a computer readable medium, for example, a floppy diskette, a CD, a DVD, a zip disk or other suitable memory device. In application, the computer readable medium would then be inserted into an appropriate reader (e.g. a CD-ROM drive), coupled to the one or more processors or execution devices, which would then cause the one or more processors to execute the stored code and perform the corresponding operations.

The event array counter 24 may consist of a single counter or a plurality of counters, each representing a particular bit offset in the data pattern and each being addressed as the counter to increment if properly enabled at a given clock edge by the bit offset signal 28 provided by the trigger processing circuit 26. In this manner, a single counter version of the invention is made where a trigger processor circuit 26 addresses a single bit position within the data pattern and window events are only incremented if the sampled windowed comparator logic value 22 is correct for one bit offset within the pattern, or a multiple counter in accordance with the instant invention is made whose trigger processor circuit 26 addresses which counter from an array of counters is to be incremented as a result of the sampled windowed comparator logic value.

The aforementioned embodiment requires the building of planes of waveform data sequentially by operating the invention and making event counts over the complete range of voltage offsets in the voltage range of interest and time offsets in the bit offsets within the bit period or periods of interest for individual bit offsets within the data period and then change the bit offset within the data period and repeat the cycle; whereas, an alternate embodiment can simultaneously collect event counts for multiple bit planes of data pattern during a single pass through the voltage offsets in the voltage offset region of interest and time offsets in the time offsets within the bit period or periods of interest. The aforementioned measurement circuit 20 uses less hardware but requires more passes through the data; whereas the alternate embodiment uses more hardware resources and is more efficient.

The event count array 24 can be reset by a processor 30 between collection sample periods at each window threshold setting and delay setting. The duration of the sample period may be set by a clock count-down timer 27 which counts the number of clocks or the number of clocks where a particular bit transition is present. This function is to assure that the number of samples taken at a particular voltage offset, time delay and bit position within the data pattern are known. When starting a new measurement at a new voltage offset, time delay and bit position within the data pattern, a reset function 29 from the processor 30 similarly resets the clock count value as well.

The trigger processing circuit 26 of the present invention provides the timing synchronization to the data pattern required to draw an eye diagram 40 (FIG. 2) that emphasizes data dependent effects. The trigger processing circuit 26 must know the number of bit samples in a data pattern, the pattern length, and then maintains a running count modulo this number 31. This number is defined by the test pattern used with the device under tests and is programmed by the processor 30. Based on this running trigger counter value 31, the clock counters and event count array is enabled to count or not. There are many possible exemplary embodiments of such a trigger element; two exemplary embodiments of the trigger processing circuit 26 according to the present invention are disclosed herein and are described in detail in FIG. 3.

The count value or array of count values 25 are read by the processor 30 after each windowed event counter measurement set at a given voltage offset within the voltage offset region of interest and time offsets within the bit period or periods of interest. Depending on which type of embodiment is used, there may be one or more count values 25 to read after each measurement set. Once these values are read by the processor 30, they can be stored in the memory means of the processor 30 for later processing, overlay and display functions.

The The sampling circuit 10 also includes a memory element 32, for example, a random access memory (RAM), a read only memory (ROM), a flash memory or any suitable volatile or non-volatile storage medium and display element 34, for example, a monitor, CRT, flat panel display, printer or any suitable display or presentation device which may be of any generally available and well understood memory or display technology.

Figure 2:
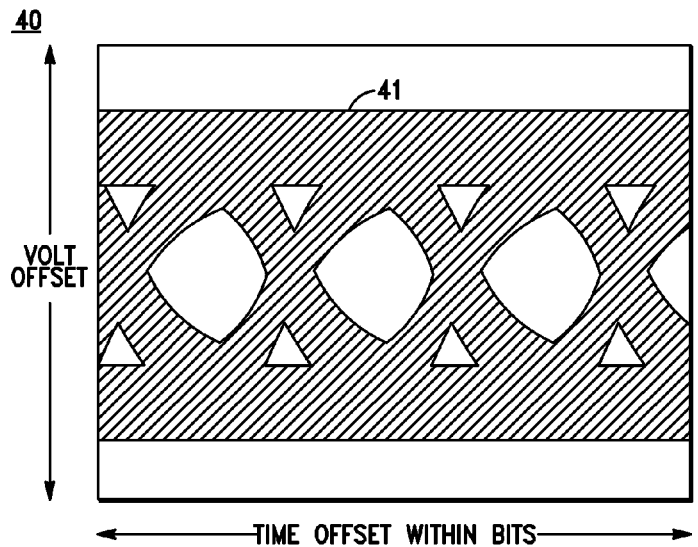
FIG. 2 illustrates an example of an eye diagram of a multi-valued signal.

FIG. 2 illustrates an exemplary eye diagram 40 that appears to have a closed-down eye opening 41 and suffers from data dependent effects. This illustration is the result of overlying numerous voltage samples of the multi-valued signal from the device under test taken at all possible time offsets within the bit periods shown. In this example, approximately 3 and one half bit periods are shown. The object of this embodiment emphasizes the data dependent effects from FIG. 2 and similar eye diagrams. It is also the expressed object of this invention to meet other objects of the invention already described.

Figure 3A:
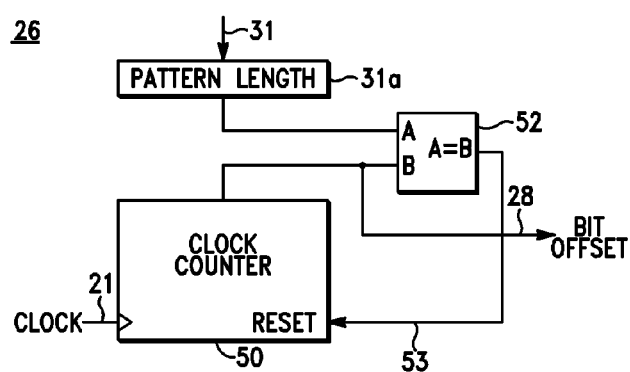
FIG. 3.a. is a schematic diagram of a trigger decoder used with one variant of the preferred embodiment from FIG. 1.

FIG. 3a is a block diagram of a preferred embodiment of the trigger processing circuit 26 of the present invention. In this embodiment, the input clock signal 21 is continuously being counted by a clock counter 50. The count value 28 from the clock counter 50 is compared to the pattern length value 31 a that is provided by the processor 30 by comparator 52. When the count value 28 equals the pattern length 31a, a reset signal 53 is generated, which causes the clock counter 50 to be reset; thereby, re-initiating clock signal counting. In this manner, the count value 28 will cycle its counts from 0 to the pattern length. The count value 28 is then also used as the bit offset value provided to the event array counter 24 which uses this count value 28 as an index to know which counter in the array of counters, to increment if so enabled at the next rising (or falling) edge of the applied clock.

The trigger processing circuit 26 described in FIG. 3a requires the processor 30 to provide the pattern length value 31a. The trigger processing circuit 26 outputs or otherwise provides the bit offset value 28 to be used by the event array counter 24.

Figure 3B:
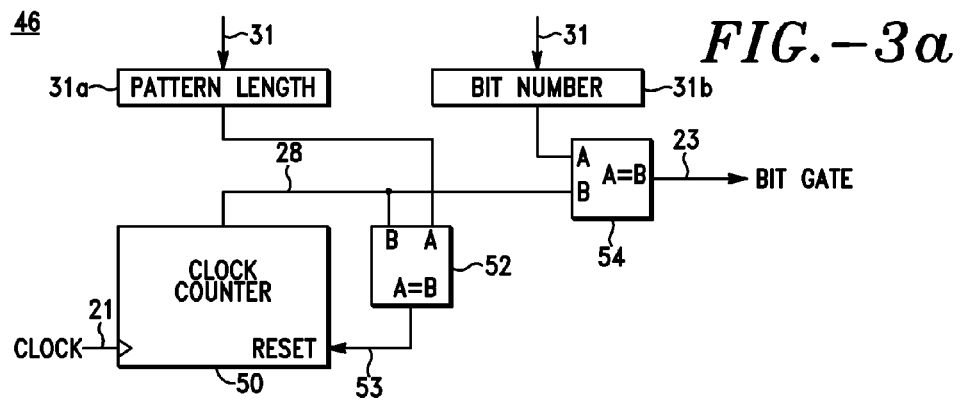

FIG. 3b is a block diagram of an alternate preferred embodiment of the trigger processing circuit 46 according to the present invention. In this trigger processing circuit 46, both the pattern length 31a and the bit number 31b corresponding to the bit offset within modulo counter of the trigger processing circuit clock counter 50 are required. These values are provided by the processor 30. Like the first embodiment of the trigger processing circuit 26 illustrated in FIG. 3a, the pattern length 31a is compared against a free-running clock counter value 28 to determine when to reset the counter 50, for example, generating a reset signal 53 and applying the signal to the counter 50. In this embodiment, the free-running clock counter 50 will count the number of clock edges from 0 to the pattern length and then recycle.

The value of the clock counter 28 is also compared to the bit number 31b by second comparator 54 and when these two values match, the second comparator 54 generates the bit gate signal 23 which is subsequently provided by the trigger processing circuit 46. The bit gate signal 23 is used by both the event array counter 24 and the clock count-down circuit 27 illustrated in FIG. 1. The bit gate signal 23 further qualifies if the event array counter, in this embodiment a single counter, will consider counting if the logic result of the sampled window comparison is valid or not. If the clock counter signal 28 does not match the bit number 31b of interest, the bit gate signal 23 will not enable counting events.

Figure 4A:
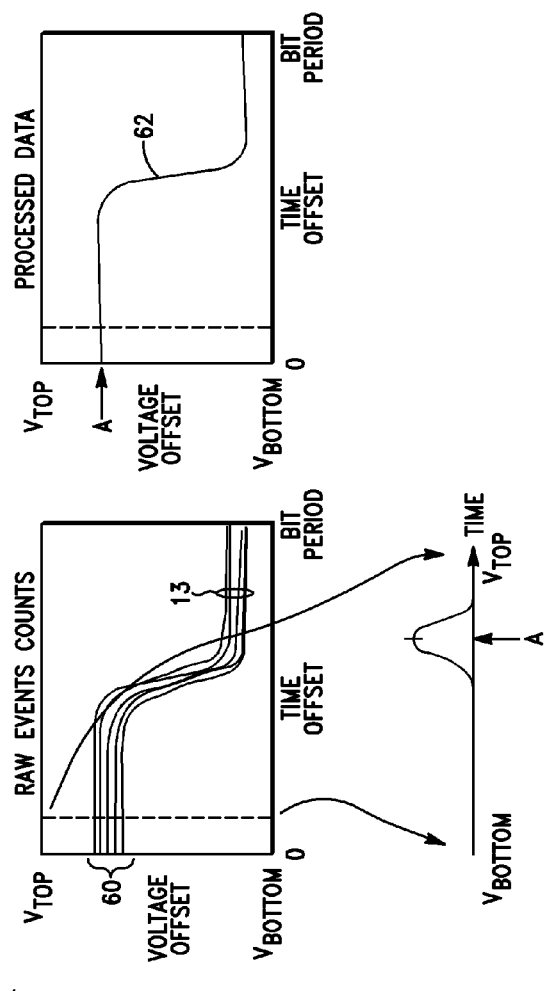
FIG. 4.a. illustrates transforming two dimensional arrays of window counts into a two dimensional array with the averaged value of the multi-valued signal.

FIG. 4a. illustrates the processing of collected data to remove non data dependent effects. This illustration shows how the raw event counts 60 for a particular bit position in the data pattern carried by the multi-valued signal 13 from the device under test 12 (FIG. 1) is noisy and holds many samples 60 covering many voltage offsets (e.g. between $V_{top}$ and $V_{bottom}$) at each time offset (e.g. 0 to Bit Period). These samples 60, ranging from $V_{top}$ to $V_{bottom}$ for each time offset are analyzed to find the average of the non-zero values, in this illustration designated with the letter A. It is at this voltage offset (e.g. A) between $V_{bottom}$ and $V_{top}$ that the average value for all sample counts at the designated time offset exists. In order to complete the processing, similar average "A" points must be determined for all time offsets within the one or more bit periods of interest. Once this is completed, processed data 62 can be constructed that shows a singular voltage offset value for all time offsets within the one or more bit periods of interest. It is the collection of these processed data structures for various bit offset positions within the data pattern that are output from processing collected data 60.

Figure 4B:
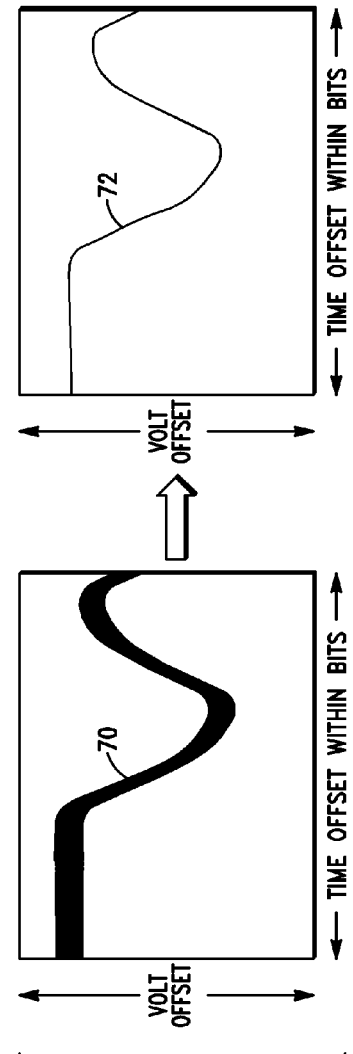

FIG. 4b. further illustrates the input 70 and output 72 of the processing collected data element of this invention for one bit offset in the data pattern. In this example, a bit offset that corresponds to the data pattern of 11010 is being analyzed. Noise clearly exists in the left-hand (e.g. input) waveform 70 which is removed in the averaged (e.g. output) waveform 72 on the right-hand side.

Figure 5:
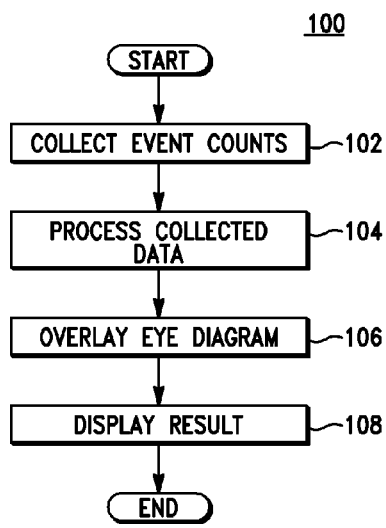
FIG. 5 is a flow-diagram illustrating the steps performed when implementing the technique of the present invention.

FIG. 5 is a flow chart illustrating the sampling and display method 100 according to an exemplary embodiment of the present invention. Although it is possible to reverse, combine, or otherwise alter the operating steps in various ways and still achieve the same result, in this exemplary embodiment the processing flow is used to accomplish the invention. The process begins at step 102, where the event counts are collected. This may be accomplished, for example, by the measurement circuit 20 sweeping voltage offsets in the voltage offset region of interest, sweeping time offsets within the one or more bit periods in the time offset region of interest and stepping through various bit offsets within the bit pattern carried by the multi-value signal provided from the device under test, while collecting counts or arrays of counts to be used in creating an eye diagram that emphasizes data dependent effects.

In step 104, the previously collected data is processed in order to remove any noise or other data or device dependent variances from the data. This may be accomplished, for example, by determining the average value of the collected (e.g. input) data for each bit offset within the data pattern.

In step 106, an overlay eye diagram is prepared, for example, by overlaying the results from the several averaged input data waveforms in a suitable manner such that they can be displayed on a corresponding display device.

In step 108, the eye diagram is presented on a suitable display device.

Other exemplary embodiments in accordance with this invention may process the data in different ways including but not limited to partial completion and partial updates to the display. These additional embodiments are anticipated as other means to draw an eye diagram that emphasize data dependent effects.

Figure 6:
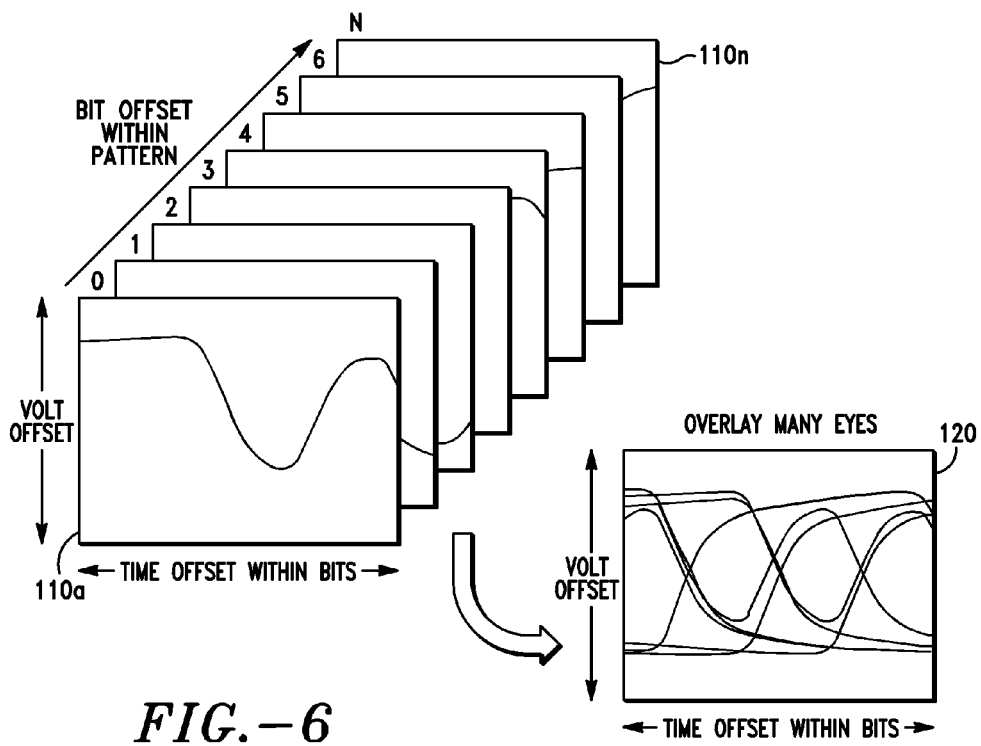
FIG. 6 illustrates processing and overlaying two dimensional arrays of window counts from many bit bit offsets within the multi-valued signal data pattern to create the desired eye diagram which emphasizes data dependent effects.

FIG. 6 further illustrates how averaged waveforms 110a-110n for various bit offsets within the data pattern are overlaid to build an aggregate eye diagram 120 that emphasizes data dependent effects. In this diagram 7 bit offsets within the pattern are used. It is clear that any number of bit offsets could be used for this purpose.

Figure 7:
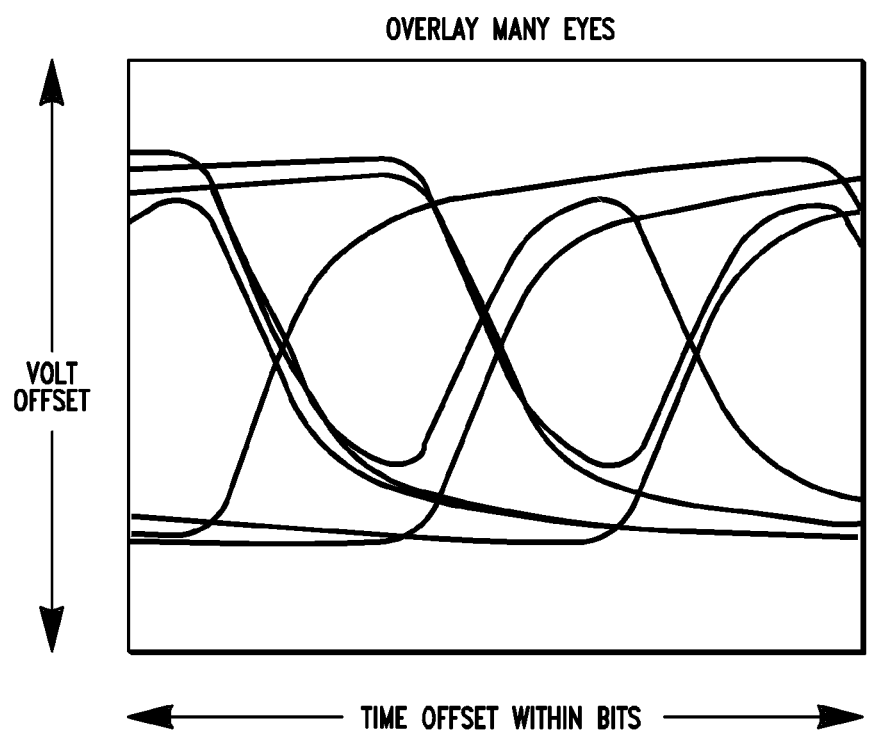
FIG. 7 illustrates how such a new type of eye diagram emphasizes data dependent effects.

FIG. 7 is an illustration of an eye diagram 130 that emphasizes data dependent effects. This diagram should be compared to the diagram of FIG. 2. In this created eye diagram 130, the noise present in all transitions of the signal, noise that was not dependent on the data, has been removed showing only clear, crisp lines indicating the extents of data dependent variation within bit transitions on the multi-valued signal. This diagram illustrates an example the achievement of the expressed objective of this invention.

In summary, the present disclosure provides a description of a sampling circuit including a window comparator, a derived pattern trigger and an event counter together with other suitable components to overlay individually averaged bit transitions of a multi-valued signal into a composite eye diagram display. To achieve this, a pattern trigger is created that defines the repetition rate of the overall pattern being tested. This pattern trigger is used to define which bit to attribute windowed event counts to. Windowed event counts are created by this invention by sweeping the two limit thresholds of a window comparator over the voltage range covering the multi-valued signal voltage extents for time offset delays within the bit period of the multi-valued signal at any desired resolution and counting the number of times the multi-valued signal is found to fall inside the window at the different window voltage offsets and time offsets. Collected window event counts for voltage and time offset sweeps are individually stored for numerous data bit offsets derived from the pattern trigger. The mean of each vertical column of windowed event counts for all time offsets within a bit period and for all bit offsets derived from the pattern trigger is determined and plotted/overlaid on an eye diagram display which emphasizes data dependent effects.

What is claimed is:

1. A measurement circuit, comprising:
   a windowed comparator operative to receive an input signal and generate an output signal having a first value when the input signal is within a desired voltage region;
   a sampling device, coupled to the windowed comparator, operative to sample the output signal and generate a sampled signal at desired time intervals, the sampled signal having a first logical value when the sampled signal is within the desired voltage region;
   an event array counter, coupled to the sampling device, operative to generate a count value signal representing the number of sampled inputs within one or more desired time offsets and the desired voltage region;
   a trigger processing circuit, coupled to the event array counter, operative to generate a bit offset signal that controls the counting of the event array counter in response to a test pattern signal; and
   a measurement circuit, wherein the desired time interval is determined by a programmable clock signal, and wherein the trigger processing circuit further includes at least one clock counter and a first signal comparator, the clock counter generating the bit offset signal in response to the programmable clock signal.

2. The measurement circuit of claim 1, further including a variable delay circuit operative to vary the desired sampling time intervals.

3. The measurement circuit of claim 1, further including a processor operative to remove non-data dependent values from the sampled signal.

4. The measurement circuit of claim 3, wherein the processor removes the non-data dependent values from the sampled signal by determining the average value of one or more sampled signals.

5. The measurement circuit of claim 1, wherein the first signal comparator circuit is operative to reset the at least clock counter when the bit offset signal is equivalent to a pattern length signal.

6. The measurement circuit of claim 5, wherein the pattern length signal is provided by the processor.

7. The measurement circuit of claim 1, further including a second signal comparator operative to generate a bit gate signal in response to the bit offset signal being equivalent to a bit number signal.

8. The measurement circuit of claim 1, wherein the trigger processing circuit further includes a clock counter, a first signal comparator and a second comparator, the clock counter generating the bit offset signal in response to a programmable clock signal, the first signal comparator operative to reset the clock counter when the bit offset signal is equal to a pattern length signal, and the second signal comparator operative to generate a bit gate signal in response to the bit offset signal being equal to a bit number signal.

9. The measurement circuit of claim 8, wherein the bit gate signal limits the operation of the event array counter to count only bit cells as determined by the trigger processing circuit.

10. The measurement circuit of claim 1, wherein the variable delay circuit is controlled by a delay control delay signal.

11. A method of generating data-dependent information, comprising:
- collecting event counts at variable bit offsets, desired time offsets within one or more bit periods and desired voltage regions;
- removing non-data dependent effects from the collected event counts;
- generating a composite diagram of the desired time offsets within the one or more bit periods of interest and desired voltage offsets within the desired voltage regions;
- generating the composite diagram further includes overlaying a plurality of signal traces within a given bit period and voltage offset region, each of the plurality of signal traces further comprising the an average value of the collected event counts sampled over the one or more bit periods; and
- displaying the composite diagram.

12. The method of claim 11, where collecting event counts includes sampling input values at one or more programmable time intervals.

13. The method of claim 11, wherein removing non-data dependent effects from the collected event counts further includes determining the average value of the collected event counts over the one or more bit periods and desired voltage regions.

* * * * *